(12) United States Patent
Kamaga et al.

(10) Patent No.: US 8,502,237 B2
(45) Date of Patent: Aug. 6, 2013

(54) SEMICONDUCTOR RECTIFYING DEVICE

(75) Inventors: Masamu Kamaga, Tokyo (JP); Makoto Mizukami, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/215,410

(22) Filed: Aug. 23, 2011

(65) Prior Publication Data

US 2012/0223332 A1    Sep. 6, 2012

(30) Foreign Application Priority Data

Mar. 3, 2011    (JP) .................... 2011-045936

(51) Int. Cl.
*H01L 29/15* (2006.01)
*H01L 31/0312* (2006.01)

(52) U.S. Cl.
USPC ............. 257/77; 257/E25.002; 257/E29.104

(58) Field of Classification Search
USPC ............ 257/77, 471, 472, E21.368, E25.002, 257/E29.104
See application file for complete search history.

(56) References Cited

U.S. PATENT DOCUMENTS

| | | | |
|---|---|---|---|
| 7,364,994 B2* | 4/2008 | Hshieh et al. | 438/525 |
| 7,508,045 B2* | 3/2009 | Nishio et al. | 257/452 |
| 2002/0125482 A1* | 9/2002 | Friedrichs et al. | 257/73 |
| 2004/0212011 A1* | 10/2004 | Ryu | 257/335 |
| 2006/0237813 A1* | 10/2006 | Hshieh et al. | 257/475 |
| 2007/0278609 A1 | 12/2007 | Harris et al. | |
| 2008/0277669 A1* | 11/2008 | Okuno et al. | 257/77 |
| 2008/0296587 A1* | 12/2008 | Yamamoto et al. | 257/77 |
| 2009/0085148 A1* | 4/2009 | Ishiguro et al. | 257/499 |
| 2009/0233415 A1* | 9/2009 | Anderson et al. | 438/422 |
| 2011/0037139 A1* | 2/2011 | Zhao et al. | 257/471 |
| 2011/0175106 A1 | 7/2011 | Mizukami et al. | |

FOREIGN PATENT DOCUMENTS

| | | |
|---|---|---|
| JP | 2003-163357 | 6/2003 |
| JP | 2007-42997 | 2/2007 |
| JP | 2007-184327 | 7/2007 |
| JP | 2008-282973 | 11/2008 |
| JP | 2008-300506 | 12/2008 |
| WO | WO 2010/021136 A1 | 2/2010 |

OTHER PUBLICATIONS

U.S. Appl. No. 13/220,107, filed Aug. 29, 2011, Mizukami.

(Continued)

*Primary Examiner* — Matthew Landau
*Assistant Examiner* — Latanya N Crawford
(74) *Attorney, Agent, or Firm* — Oblon, Spivak, McClelland, Maier & Neustadt, L.L.P.

(57) ABSTRACT

A semiconductor rectifying device of an embodiment includes a first-conductive-type semiconductor substrate made of a wide bandgap semiconductor, a first-conductive-type semiconductor layer formed on an upper surface of the semiconductor substrate and made of the wide bandgap semiconductor having an impurity concentration lower than that of the semiconductor substrate, a first-conductive-type first semiconductor region formed at a surface of the semiconductor layer and made of the wide bandgap semiconductor, a second-conductive-type second semiconductor region formed around the first semiconductor region and made of the wide bandgap semiconductor, a second-conductive-type third semiconductor region formed around the first semiconductor region and made of the wide bandgap semiconductor having a junction depth deeper than a junction depth of the second semiconductor region, a first electrode that is formed on the first, second, and third semiconductor regions, and a second electrode formed on a lower surface of the semiconductor substrate.

7 Claims, 15 Drawing Sheets

OTHER PUBLICATIONS

Japanese Office Action mailed Mar. 5, 2013, in Japanese Patent Application No. 2011-045936 filed Mar. 3, 2011 (with English Translation).

Japanese Office Action mailed on Jun. 4, 2013, in Japanese Patent Application No. 2011-045936 filed on Mar. 3, 2011 (with English Translation).

* cited by examiner

SEMICONDUCTOR RECTIFYING DEVICE

CROSS-REFERENCE TO RELATED APPLICATION

This application is based upon and claims the benefit of priority from Japanese Patent Application No. 2011-045936, filed on Mar. 3, 2011, the entire contents of which are incorporated herein by reference.

FIELD

Embodiments described herein relate generally to a semiconductor rectifying device.

BACKGROUND

Currently a PiN diode having a pn junction and a Schottky barrier diode (SBD) having a carrier potential barrier generated by a difference of a work function between a semiconductor layer and metal are mainly used as the semiconductor rectifying device that rectifies an input current and outputs the rectified current. In the Schottky barrier diode, in order to relax an electric field applied to an interface between the semiconductor layer and the metal, there is a JBS (Junction Barrier Schottky barrier diode) in which an impurity region (for example, p type) having a conductive type different from that of a semiconductor layer (for example, n type) is disposed on a surface of the semiconductor layer. There is also an MPS (Merged PiN-diode Schottky-diode), in which an ohmic junction is established between the impurity region (for example, p type) and the metal of the JBS or contact between the impurity region and the metal is brought close to the ohmic junction, minority carrier injection is generated when a voltage exceeding a built-in potential (Vbi) between the impurity region and the semiconductor layer, and a resistance is decreased by conductivity modulation.

On the other hand, a wide bandgap semiconductor typified by silicon carbide (hereinafter also referred to as SiC) is expected to be a next-generation power semiconductor device. The wide bandgap semiconductor has a band gap wider than that of silicon (Si), breakdown field strength higher than that of Si, and thermal conductivity higher than that of Si. The low-loss power semiconductor device that can be operated at a high temperature can be implemented when the characteristics of the wide bandgap semiconductor are utilized.

In the MPS, forward characteristics are achieved at a low resistance when the voltage at which the conductivity modulation is generated is decreased, and a large amount of current can be discharged at the low forward voltage when a forward surge current flows in. When the current larger than that in a steady state flows in, the current causes crystal destruction due to heat generation, junction destruction in the electrode, and the like under the following equation, current×voltage=power. On the other hand, when the large current can flow at the low forward voltage, the heat generation is suppressed to decrease a destruction ratio of an element.

DETAILED DESCRIPTION

Figure 1:
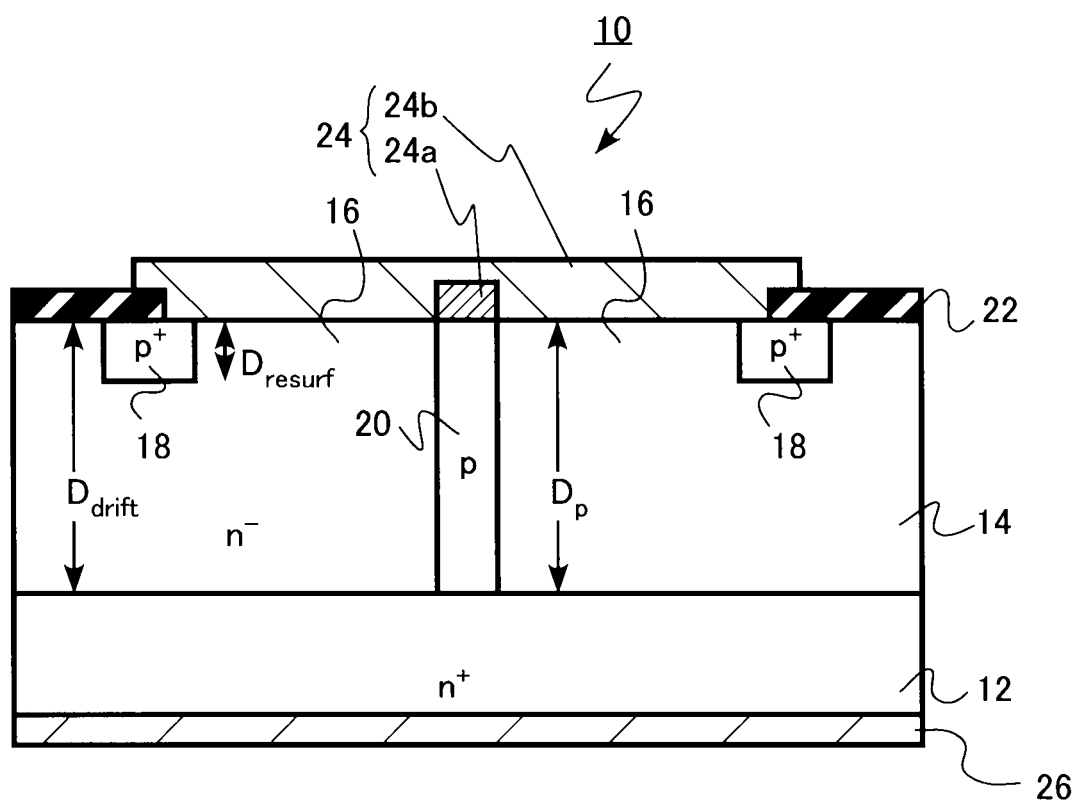
FIG. 1 is a sectional view illustrating a semiconductor rectifying device according to a first embodiment.

A semiconductor rectifying device of an embodiment includes a first-conductive-type semiconductor substrate that is made of a wide bandgap semiconductor, a first-conductive-type semiconductor layer that is formed at an upper surface of the semiconductor substrate and made of the wide bandgap semiconductor having an impurity concentration lower than that of the semiconductor substrate, a first-conductive-type first semiconductor region that is formed on a surface of the semiconductor layer and made of the wide bandgap semiconductor; a second-conductive-type second semiconductor region that is formed around the first semiconductor region and made of the wide bandgap semiconductor, a second-conductive-type third semiconductor region that is sandwiched between the first semiconductor region and made of the wide bandgap semiconductor having a junction depth deeper than a junction depth of the second semiconductor region, a first electrode that is formed on the first, second, and third semiconductor regions, and a second electrode that is formed on a lower surface of the semiconductor substrate.

The inventors found that, even if a structure of a related art is used, the minority carrier is injected and the voltage (hereinafter referred to as a hole injection voltage when the minority carrier is a hole) at which the conductivity modulation is generated is insufficiently decreased in the MPS in which the wide bandgap semiconductor having the required withstanding voltage of 1200 V or more (hereinafter also referred to as at a level of 1200 V) is used.

For example, in a Si MPS of a related art, the voltage at which the conductivity modulation is generated ranges from 1 V to 1.5 V with respect to the Si built-in potential Vbi=0.8 V to 1.0 V. In the SiC MPS, for the element having the withstanding voltage at a level of 600 V, the voltage at which the conductivity modulation is generated is 3.2 V with respect to the SiC built-in potential Vbi=2.5 V to 3.0 V, and the minority carrier is injected by applying the voltage of +1 V or less with respect to the SiC built-in potential Vbi (the SiC MPS in which a p type impurity region has a width of 2 μm while an n type Schottky region has a width of 0.8 μm, at 125° C.).

In the MPS, generally the width of the p type impurity region is narrowed because the p type impurity region becomes a dead space when an electron current (majority carrier) flows. Therefore, for example, the width of the p type impurity region is set to 1 μm, and the width of the n type impurity region (width of an n type Schottky region) is set to 1 μm, and the hole injection voltage of the MPS is computed at 125° C. As a result, the hole injection voltage is 4.4 V for the element having the withstanding voltage at the level of 600 V, the hole injection voltage is 6.9 V for the element having the withstanding voltage at the level of 1200 V, the hole injection voltage is 10.85 V for the element having the withstanding voltage at the level of 3300 V, and the hole injection voltage is 13.53 V for the element having the withstanding voltage at the level of 4500 V. Accordingly, in the middle-withstanding voltage element at the level of 1200 V or more and the high-withstanding voltage element at the level of 3300 V or more, the hole injection voltage is significantly increased, and it is not expected that the resistance is decreased by the conductivity modulation.

Hereinafter, embodiments of the present invention are described in detail with reference to the drawings.

As used herein, "the width of the semiconductor region" means a shortest distance from one point in an end portion of a graphic defining the semiconductor region to another end portion that is located with the semiconductor region interposed therebetween. For example, when the semiconductor region has the width of 15 μm or more, the width is 15 μm or more in at least 50% of the end portion of the graphic defining the semiconductor region.

The "impurity concentration" means a concentration of a difference between a donor atom concentration and an acceptor atom concentration in the semiconductor.

First Embodiment

A semiconductor rectifying device of a first embodiment includes a first-conductive-type semiconductor substrate that is made of a wide bandgap semiconductor, a first-conductive-type semiconductor layer that is formed on an upper surface of the semiconductor substrate (one surface) and made of the wide bandgap semiconductor having an impurity concentration lower than that of the semiconductor substrate, a first-conductive-type first semiconductor region that is formed on a surface of the semiconductor layer and made of the wide bandgap semiconductor, a second-conductive-type second semiconductor region that is formed around the first semiconductor region and made of the wide bandgap semiconductor, a second-conductive-type third semiconductor region that is sandwiched between the first semiconductor regions and made of the wide bandgap semiconductor having a junction depth deeper than a junction depth of the second semiconductor region, a first electrode that is formed on the first, second, and third semiconductor regions, and a second electrode that is formed on a lower surface of the semiconductor substrate (the other surface).

The third semiconductor region is in contact with the semiconductor substrate.

In the following description, by way of example, the semiconductor rectifying device is the MPS, the wide bandgap semiconductor is silicon carbide (hereinafter sometimes referred to as SiC), and the first conductive type is set to the n type while the second conductive type is set to the p type.

Figure 2:
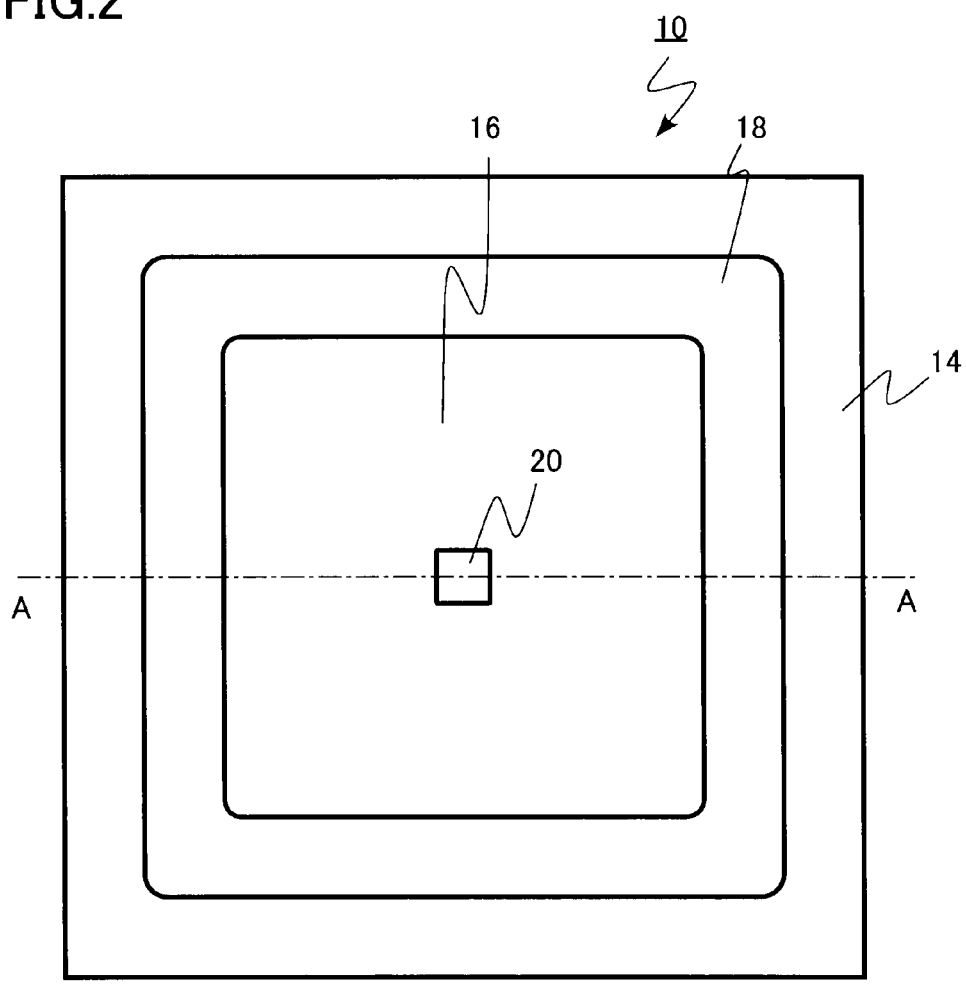
FIG. 2 is a plan view illustrating the semiconductor rectifying device of the first embodiment.

FIGS. 1 and 2 are a sectional view and a plan view schematically illustrating the semiconductor rectifying device of the first embodiment, respectively. FIG. 1 is a sectional view taken on a line of A-A of FIG. 2.

As illustrated in FIG. 1, in an MPS 10 of the first embodiment, for example, an n⁻ type SiC layer 14 having an impurity concentration lower than that of an n⁺ type 4H-SiC substrate (semiconductor substrate, hereinafter sometimes simply referred to as SiC substrate) 12 is formed as a drift layer (semiconductor layer) on an upper surface of the 4H-SiC substrate 12. For example, the SiC substrate 12 and the n⁻ type SiC layer 14 contain N (nitrogen) as an impurity.

For example, the n⁺ type SiC substrate 12 is a low-resistance substrate having impurity concentrations of about 5E+17 to about 1E+19 atoms/cm³. The n⁻ type SiC layer 14 has impurity concentrations of about 1E+14 atoms/cm³ to about 5E+16 atoms/cm³, preferably the impurity concentrations of about 5E+14 atoms/cm³ to about 1E+16 atoms/cm³. In FIG. 1, for example, a thickness ($D_{drift}$) is not lower than 8 μm.

The MPS 10 is an MPS having required withstanding voltages of 1200 V to 7000 V, namely, what they call a middle-withstanding voltage MPS at a level of 1200 V to a high-withstanding voltage MPS at a level of 7000 V. In order to achieve the high withstanding voltage and the sufficient on-current density, desirably the n⁻ type SiC layer 14 has the above-described impurity concentration and thickness.

An n type impurity region (n type Schottky region; first semiconductor region) 16 exists at a surface of the n⁻ type SiC layer 14. The n type impurity region 16 corresponds to an upper portion of the n⁻ type SiC layer 14.

A p+ type RESURF region (second semiconductor region) 18 is formed around the n− type SiC layer 14. In FIG. 1, for example, the RESURF region 18 has junction depths ($D_{resurf}$) of about 0.3 to about 1.0 μm.

The RESURF region 18 is made of SiC that has, for example, impurity Al (aluminum) or B (boron) contents of about 1E+17 atoms/cm$^3$ to about 1E+18 atoms/cm$^3$. The RESURF region 18 is provided to stabilize the withstanding voltage of the MPS.

A p type impurity region (third semiconductor region) 20 is formed while sandwiched between the n type impurity regions 16 or surrounded by the n type impurity region 16. The p type impurity region 20 has the impurity concentration that is equal to or one digit higher than that of the n− type SiC layer. That is, the p type impurity region 20 has, for example, impurity Al (aluminum) or B (boron) contents of about 1E+14 atoms/cm$^3$ to about 5E+17 atoms/cm$^3$, preferably contents of about 5E+14 atoms/cm$^3$ to about 1E+17 atoms/cm$^3$. The impurity concentration of the p type impurity region 20 is lower than that of the SiC substrate 12.

In FIG. 1, the p type impurity region 20 has a junction depth ($D_p$) that is deeper than the junction depth ($D_{resurf}$) of the RESURF region 18, and the p type impurity region 20 is in contact with the SiC substrate 12. For example, the p type impurity region 20 has widths of about 1 μm to about 20 μm.

The surface of the n− type SiC layer 14 is covered with an insulating film 22 made of, for example, a silicon oxide film. An ohmic electrode 24a made of, for example, Ti (titanium)/Al (aluminum) is formed on the p type impurity region 20 in an opening of the insulating film 22 such that an ohmic junction is established between the ohmic electrode 24a and the p type impurity region 20.

A Schottky electrode 24b made of, for example, Ni (nickel) is formed such that Schottky junction is established between the n type impurity region 16 and the Schottky electrode 24b. The Schottky electrode 24b is formed so as to be also in contact with part of the surface of the RESURF region 18.

The ohmic electrode 24a and the Schottky electrode 24b constitute a first electrode (anode electrode) 24. A second electrode (cathode electrode) 26 made of, for example, Ni is formed on a lower surface of the n+ type SiC substrate 12. The ohmic junction is established between the SiC substrate 12 and the second electrode (cathode electrode) 26.

As illustrated in FIG. 2, when the MPS 10 is viewed from above, the one square-shaped p type impurity region 20 is located in a central portion of the n type impurity region 16 while surrounded by the n type impurity region 16.

The RESURF region 18 is formed around the n type impurity region 16 so as to surround the n type impurity region 16. The n type impurity region 16 and the p type impurity region 20, which are surrounded by the RESURF region 18, constitute an active region of the MPS 10.

Figure 3:
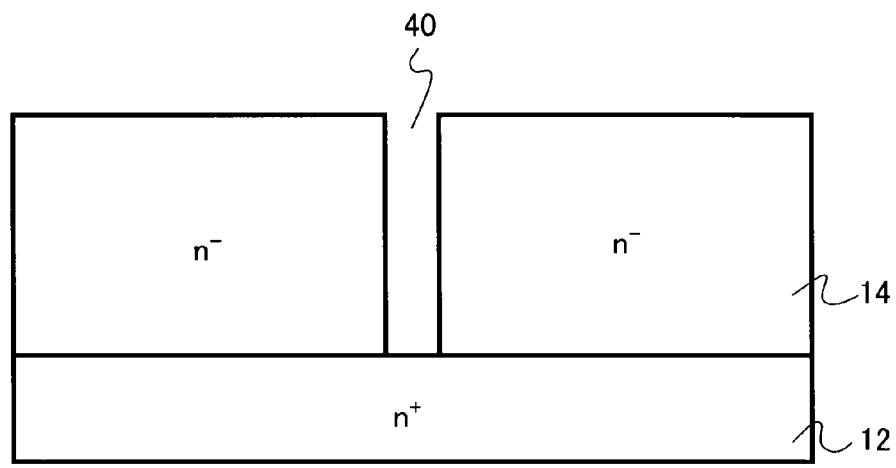
FIG. 3 is a sectional view illustrating a method for producing the semiconductor rectifying device of the first embodiment.
Figure 4:
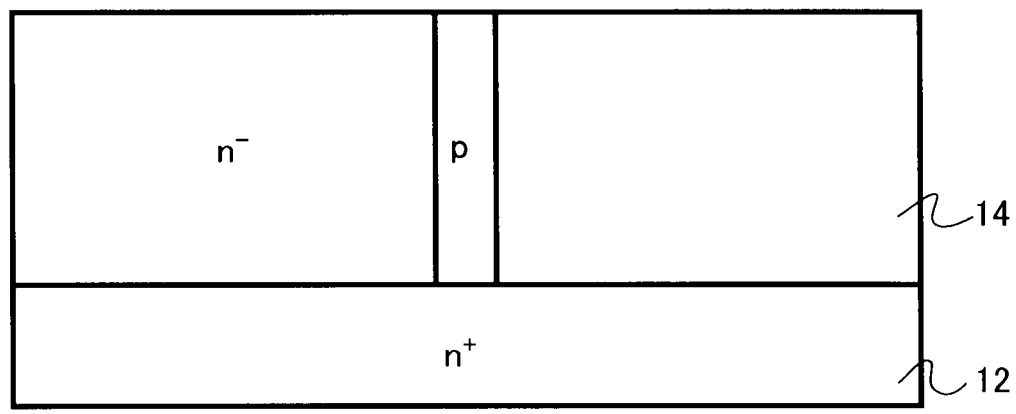
FIG. 4 is a sectional view illustrating the method for producing the semiconductor rectifying device of the first embodiment.
Figure 5:
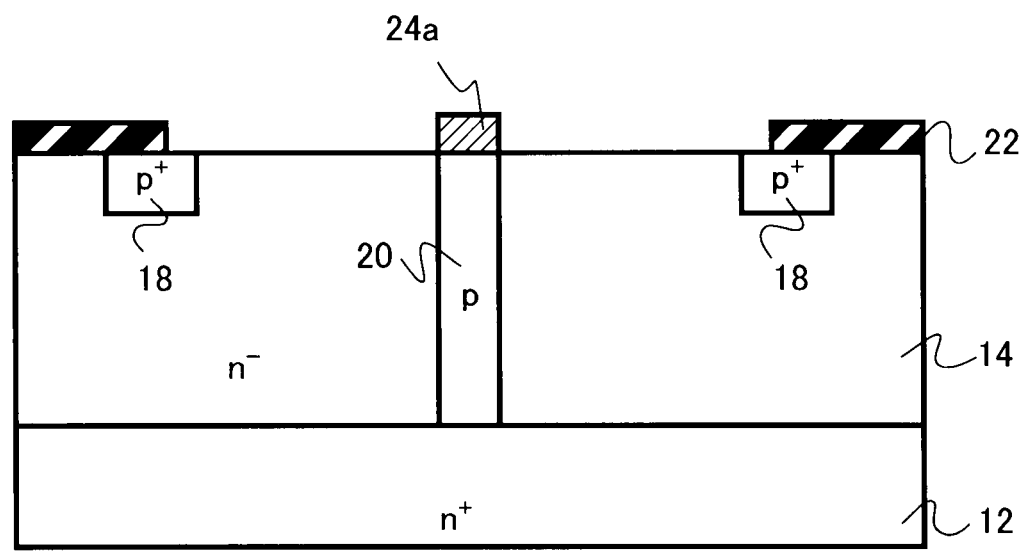
FIG. 5 is a sectional view illustrating the method for producing the semiconductor rectifying device of the first embodiment.

A method for producing the semiconductor rectifying device of the first embodiment of FIGS. 1 and 2 will be described below. FIGS. 3 to 5 are sectional views illustrating the method for producing the semiconductor rectifying device of the first embodiment.

At first, the n− type SiC layer 14 having thicknesses ($D_{drift}$ in FIG. 1) of 8 μm or more is formed on the upper surface of the type SiC substrate 12 by epitaxial growth. A mask material (not illustrated) is patterned on the surface of the n− type SiC layer 14 by a lithography method. A trench 40 is formed using the mask material (see FIG. 3). At this point, etching is performed such that a bottom portion of the trench 40 reaches the SiC substrate 12.

The trench 40 is filled with p type Sic to form the p type impurity region 20 by the epitaxial growth (see FIG. 4).

Then the surface of the n− type SiC layer 14 is patterned using a mask material by the lithography method. Ion implantation of Al or B is performed with the mask material as a mask. The mask material is removed, and the substrate is washed. Then activation annealing is performed at temperatures of 1500° C. to 2000° C. Thus, the RESURF region 18 is formed.

Then an insulating film (not illustrated) made of, for example, a silicon oxide film is formed, and the patterning is performed by the lithography method and an RIE method such that the p type impurity region 20 is exposed. The ohmic electrode 24a is formed by the patterning after Ti/A is deposited by, for example a sputtering method.

The insulating film 22 made of, for example, the silicon oxide film is formed, and the patterning is performed by the lithography method and the RIE method such that the n type impurity region 16, the p type impurity region 20, and the RESURF region 18 are partially exposed (see FIG. 5).

The Schottky electrode 24b is formed by, for example the patterning after Ni is deposited by the sputtering method. The second electrode (cathode electrode) 26 is formed on the lower surface of the SiC substrate 12 by the patterning after Ni is deposited by, for example the sputtering method. Then, for example, a sintering process is performed at temperatures of 700° C. to 1000° C.

The semiconductor rectifying device of FIGS. 1 and 2 can be produced through the above-described producing method.

Figure 6:
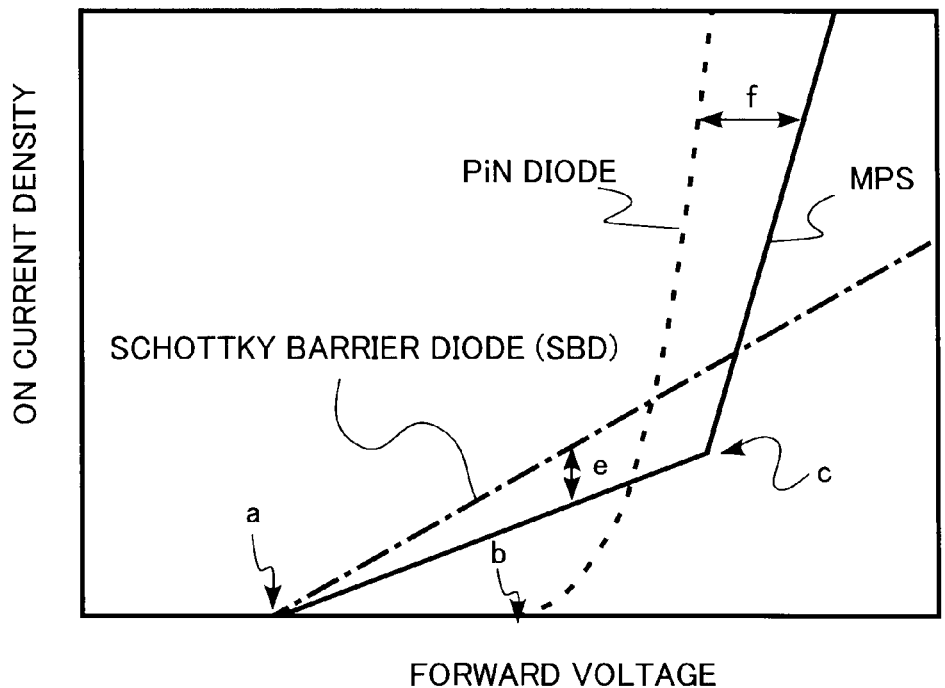
FIG. 6 is an explanatory view of a relationship between a forward voltage and an on-current density in various semiconductor rectifying devices.

FIG. 6 is an explanatory view of a relationship between a forward voltage and an on-current density in various semiconductor rectifying devices. The on-current density of the SBD illustrated by an alternate long and short dash line rises at a voltage indicated by an arrow a. The rise voltage depends on a Schottky barrier height ($\phi B$) of a Schottky junction between the anode electrode and the n type impurity region.

On the other hand, the on-current density of the PiN diode illustrated by a dotted line rises at a voltage indicated by an arrow b. The rise voltage depends on the built-in potential (Vbi) of a pn junction.

In the case of the MPS having both the Schottky junction and the pn junction, the on-current density indicated by a solid line rises at the voltage indicated by the arrow a, a conductivity modulation is generated at a voltage indicated by an arrow c at which hole injection is generated, namely, at the time the on-current density reaches a hole injection voltage, and the on-current density is steeply increased. Heat generation is suppressed by decreasing the hole injection voltage, whereby a destruction ratio of element can be reduced when a forward surge current is generated.

A difference in on-current density between the MPS and the SBD indicated by a two-headed arrow e is increased with increasing ratio of an area of the p type impurity region provided in the MPS. A difference in on-current density between the MPS and the PiN diode indicated by a two-headed arrow f is decreased with increasing ratio of the area of the p type impurity region.

Figure 7:
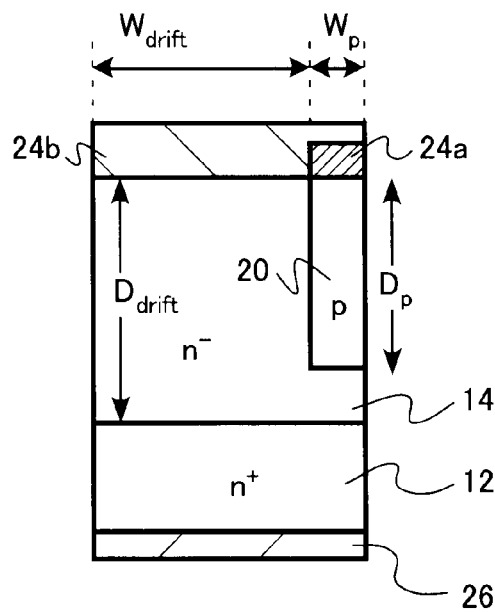
FIG. 7 is a sectional view illustrating a structure of a semiconductor rectifying device used in a simulation.

FIG. 7 is a sectional view illustrating a structure of a semiconductor rectifying device used in a simulation of a current-voltage characteristic. It is assumed that a unit structure is a half pitch of the n type impurity region 16 and the p type impurity region 20 of the active region of the MPS.

$W_p$ is a half of the width of the p type impurity region 20, and $W_{drift}$ is a half of the width of the n type impurity region 16. $D_p$ is the depth of the p type impurity region 20, and $D_{drift}$ is the thickness of the n− type SiC layer 14 that is of the drift layer. It was assumed that the n+ type SiC substrate 12 had the impurity concentration of 1E+18 atoms/cm$^3$ while the n$^-$ type SiC layer 14 had the impurity concentration of 4E+15 atoms/cm$^3$.

Dependence of the on-current density (hole current density) on the depth of the p type impurity region was estimated by the simulation while the first electrode (anode electrode) 24 including the ohmic electrode 24a and the contact electrode 24b and the second electrode (cathode electrode) 26. The depth $D_p=n \times D_{drift}$ of the p type impurity region was estimated using a parameter n=0.1 to 1.0.

Figure 8:
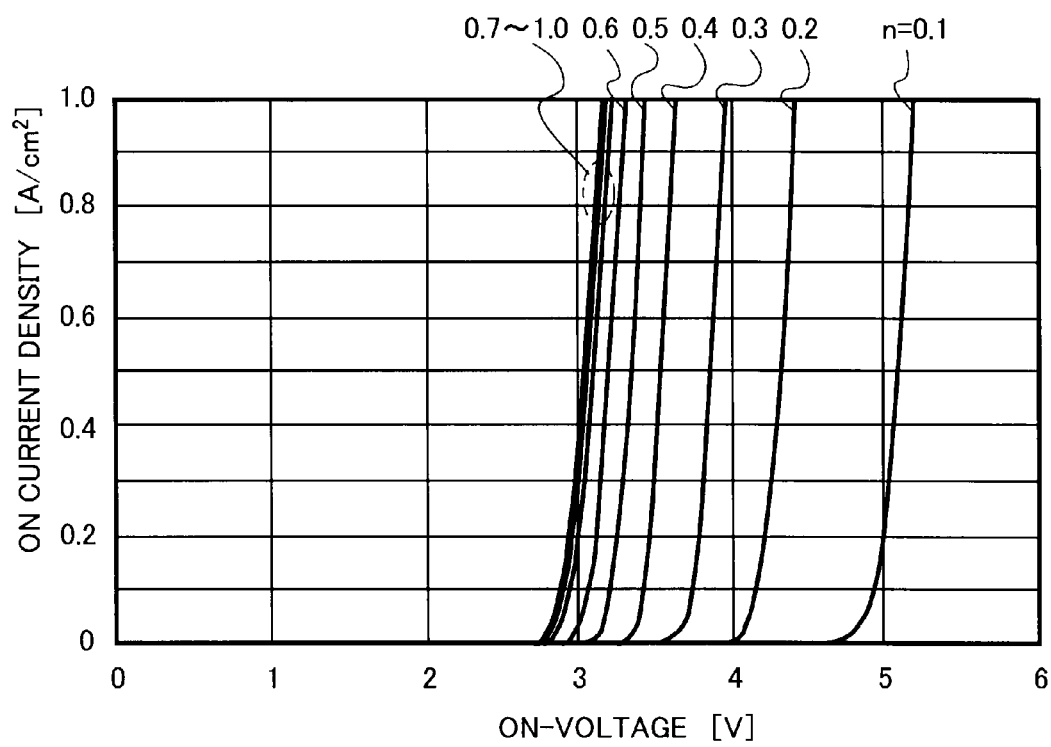
FIG. 8 is a view illustrating a simulation result of the semiconductor rectifying device of the first embodiment.

FIG. 8 is a view illustrating the simulation result of the dependence of the on-current density on the depth ($D_p$) of the p type impurity region for the semiconductor rectifying device of the first embodiment. As can be seen from FIG. 8, when the depth of the p type impurity region 20 is increased (n is increased), the rise voltage of the on-current density is reduced, namely, the hole injection voltage is reduced.

The increase in hole injection voltage in the middle- and high-withstanding voltage MPS is attributed to the fact that the voltage applied to the thick, low-concentration drift layer is increased to hardly apply the voltage to the p type impurity region 20. Accordingly, the reason the hole injection voltage can be decreased by increasing the depth of the p type impurity region 20 as illustrated in FIG. 8 is attributed to the fact that the voltage is easily applied to the p type impurity region 20.

According to the semiconductor rectifying device of the first embodiment, the hole injection voltage can be reduced by increasing the depth of the p type impurity region 20 when the forward voltage is applied. The large current is passed by the low forward voltage, which allows the heat generation to be suppressed to reduce the destruction ratio of the element. Therefore, the semiconductor rectifying device in which the wide bandgap semiconductor having the sufficient surge-current resistance characteristic is used can be provided.

The hole injection voltage can be reduced without increasing an occupancy of the p type impurity region 20 in the active region. The low on-resistance can be achieved in the state in which the semiconductor rectifying device is operated only by electrons (majority carrier). Accordingly, the balance of the high on-current and the sufficient surge-current resistance characteristic can be established.

In the first embodiment, because the p type impurity region 20 is in contact with the SiC substrate 12, the n$^-$ type SiC layer 14 is not interposed between the bottom portion of the p type impurity region 20 and the SiC substrate 12. A voltage drop is not generated in the n$^-$ type SiC layer 14 when the forward voltage is applied, so that the low hole injection voltage can be achieved.

In the semiconductor rectifying device of the first embodiment, unless the bottom portion of the p type impurity region 20 is pinched off by a depletion layer in applying a reverse voltage, possibly dielectric breakdown is generated between the p type impurity region 20 and the SiC substrate 12 to degrade the withstanding voltage. Accordingly, desirably the impurity concentrations of the p type impurity region 20 and the SiC substrate 12 and the width of the p type impurity region 20 are designed such that the p type impurity region 20 is pinched off in applying the reverse voltage.

At the same time, desirably the impurity concentration of the p type impurity region 20 is designed such that the resistance of the p type impurity region is decreased to sufficiently increase the on-current after the hole injection is started.

First Modification of First Embodiment

Figure 9:
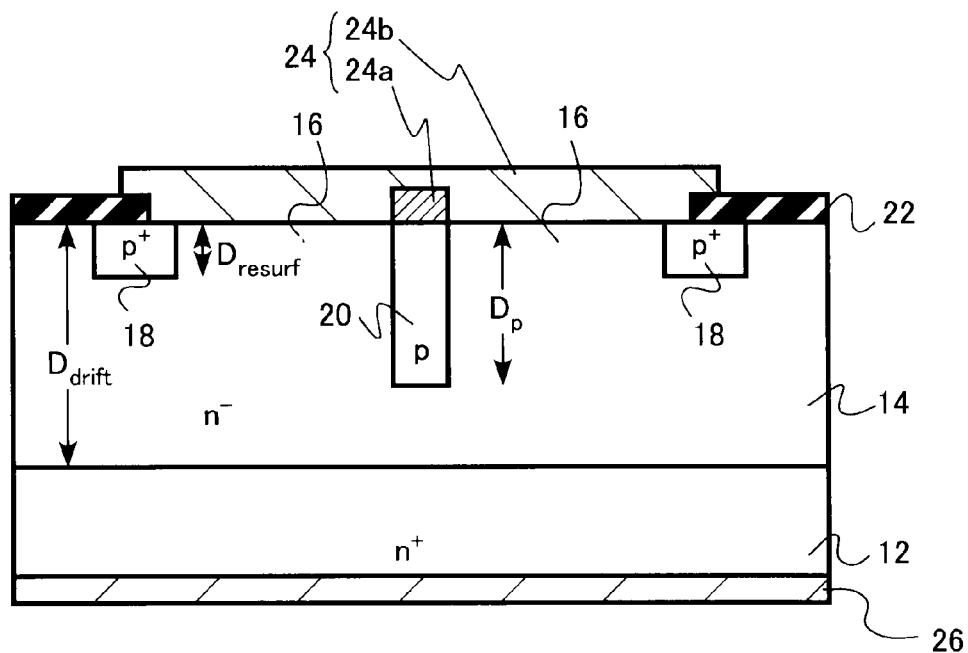
FIG. 9 is a sectional view illustrating a semiconductor rectifying device according to a first modification of the first embodiment.

FIG. 9 is a schematic sectional view illustrating a semiconductor rectifying device according to a first modification of the first embodiment. The first modification of the first embodiment differs from the first embodiment in that the p type impurity region 20 is not in contact with the SiC substrate 12, namely, the depth $D_p$ of the p type impurity region 20 is shallower than the thickness $D_{drift}$ of the n$^-$ type SiC layer 14.

The hole injection voltage is effectively reduced in a range where the depth $D_p$ of the p type impurity region 20 is deeper than the depth $D_{resurf}$ of the RESURF region 18. As is clear from FIG. 8, the hole injection voltage is significantly reduced when the depth $D_p$ of the p type impurity region 20 is not shallower or lower than a half (n=0.5) of the thickness $D_{drift}$ of the n$^-$ type SiC layer 14.

Accordingly, it is necessary that the depth $D_p$ of the p type impurity region 20 be deeper than the depth $D_{resurf}$ of the RESURF region 18, and desirably the depth $D_p$ of the p type impurity region 20 is not shallower or lower than a half (0.5 fold) of the thickness $D_{drift}$ of the n$^-$ type SiC layer 14. More desirably the depth $D_p$ of the p type impurity region 20 is not lower than 0.6 fold the thickness $D_{drift}$ of the n$^-$ type SiC layer 14, most desirably 0.7 fold the thickness $D_{drift}$ of the n$^-$ type SiC layer 14.

As is clear from FIG. 8, when the depth $D_p$ of the p type impurity region 20 is not lower than 0.6 fold ($D_p=0.6 \times D_{drift}$) the thickness $D_{drift}$ of the n$^-$ type SiC layer 14, the on-state current is sufficiently passed at the voltage as low as 3 V. The on-state current that is substantially equal to the case in which the p type impurity region 20 is in contact with the SiC substrate 12 ($D_p=1.0 \times D_{drift}$) is passed when the depth $D_p$ of the p type impurity region 20 is not lower than 0.7 fold ($D_p 0.7 \times D_{drift}$) the thickness $D_{drift}$ of the n$^-$ type SiC layer 14.

According to the first modification of the first embodiment, because the depth of the p type impurity region 20 is decreased, the p type impurity region 20 is easily formed such that the etching and the filling of the trench are easily performed. Accordingly, the high-performance semiconductor rectifying device is implemented at low cost.

Second Modification of First Embodiment

Figure 10:
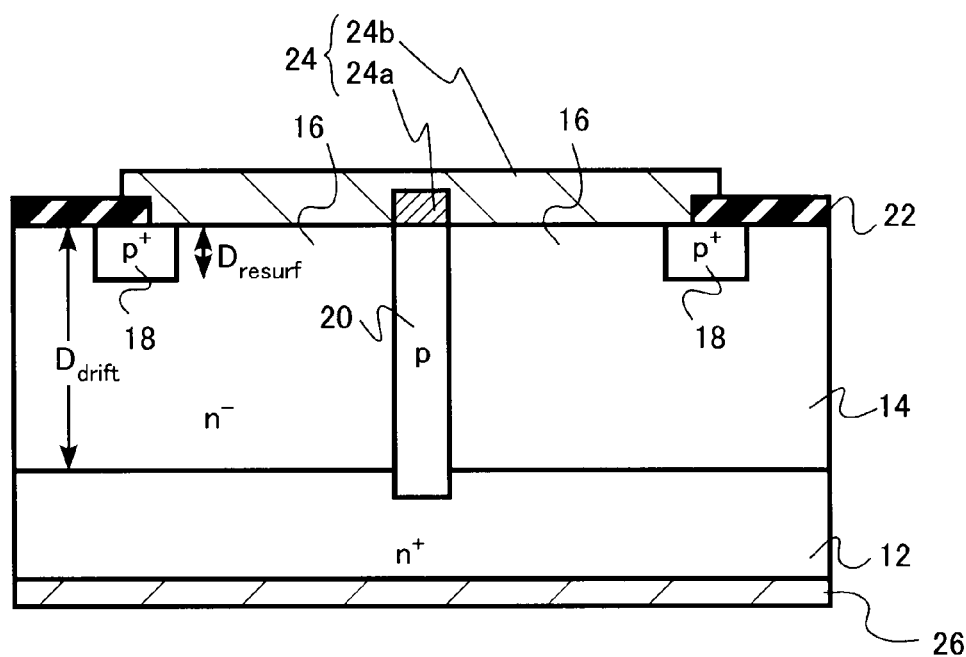
FIG. 10 is a sectional view illustrating a semiconductor rectifying device according to a second modification of the first embodiment.

FIG. 10 is a schematic sectional view illustrating a semiconductor rectifying device according to a second modification of the first embodiment. The second modification of the first embodiment differs from the first embodiment in that the p type impurity region 20 is formed while entering the SiC substrate 12.

The same effect as the first embodiment is achieved in the second modification of the first embodiment. Additionally, a process margin is increased when the trench is etched to form the p type impurity region 20. Accordingly, the semiconductor rectifying device having small variations in characteristics in a wafer surface can be implemented, for example.

Third Modification of First Embodiment

Figure 11:
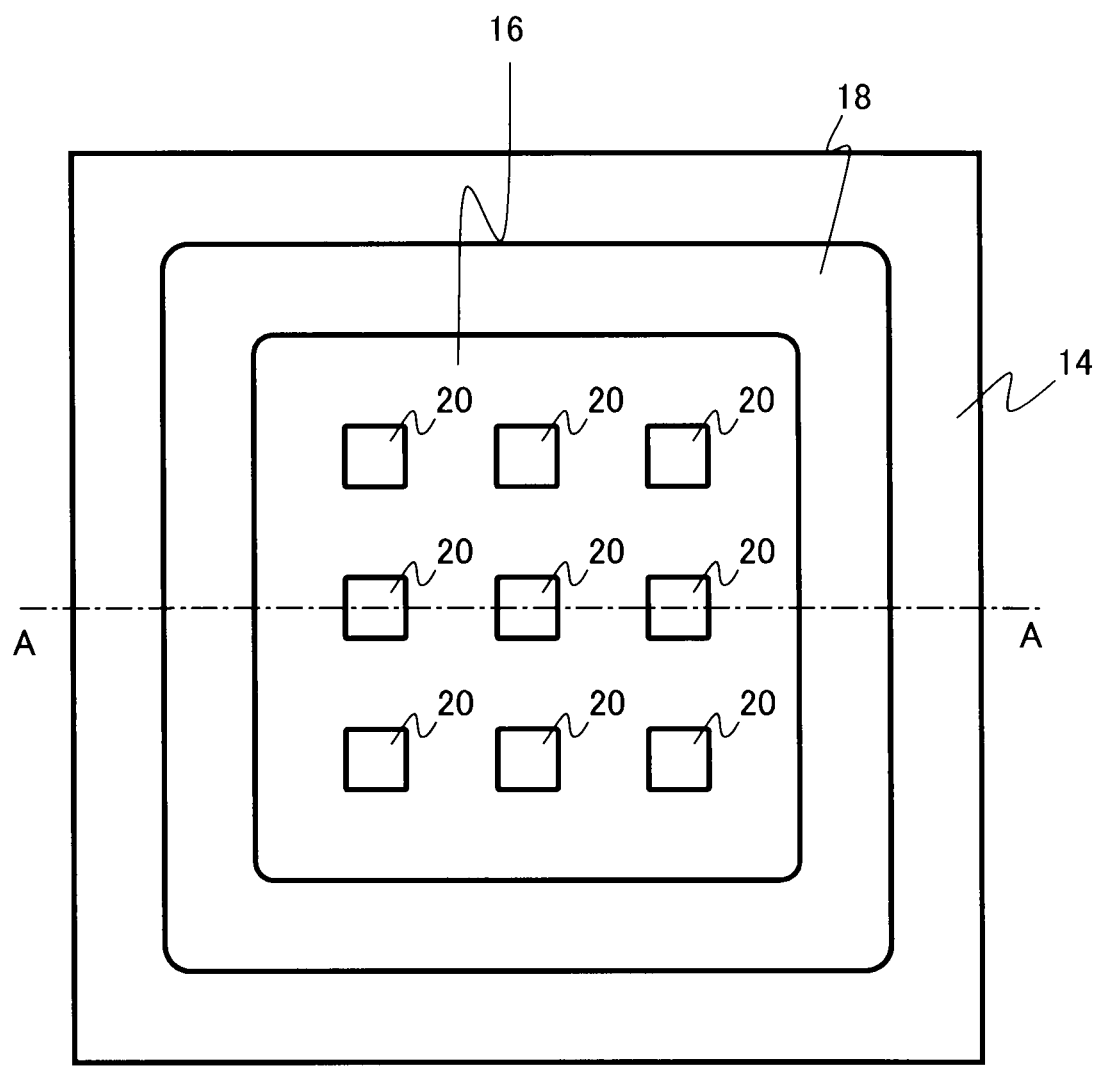
FIG. 11 is a plan view illustrating a semiconductor rectifying device according to a third modification of the first embodiment.

FIG. 11 is a schematic plan view illustrating a semiconductor rectifying device according to a third modification of the first embodiment. The third modification of the first embodiment differs from the first embodiment in that the plural (nine) p type impurity regions 20 are formed.

According to the third modification of the first embodiment, an occupied area in the activation region of the p type impurity region 20 is enlarged, so that an on-current amount can be increased after the hole injection is started in forward characteristics of the MPS.

Fourth Modification of First Embodiment

Figure 12:
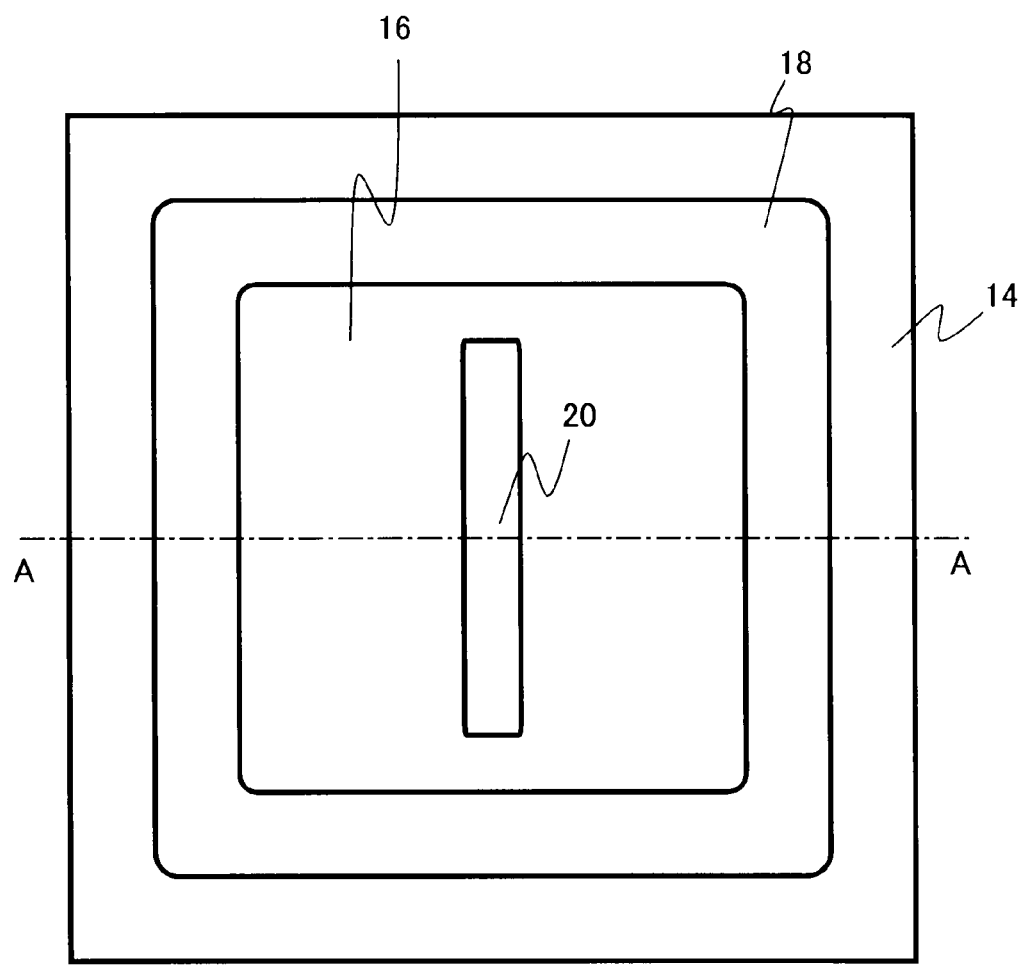
FIG. 12 is a plan view illustrating a semiconductor rectifying device according to a fourth modification of the first embodiment.

FIG. 12 is a schematic plan view illustrating a semiconductor rectifying device according to a fourth modification of the first embodiment. The fourth modification of the first embodiment differs from the first embodiment in that the p type impurity region 20 is formed into not the square shape, but a rectangular shape.

According to the fourth modification of the first embodiment, the on-current amount can be increased after the hole injection is started in the forward characteristics of the MPS.

Fifth Modification of First Embodiment

Figure 13:
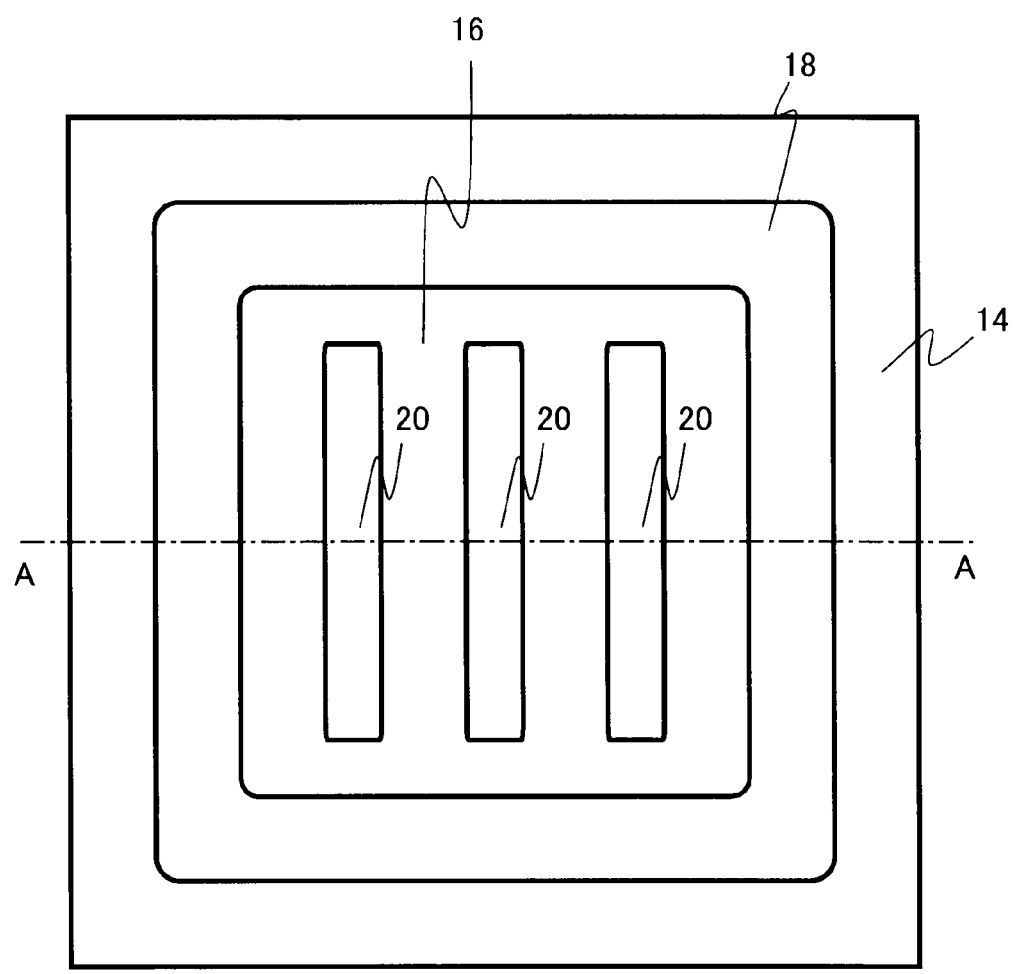
FIG. 13 is a plan view illustrating a semiconductor rectifying device according to a fifth modification of the first embodiment.

FIG. 13 is a schematic plan view illustrating a semiconductor rectifying device according to a fifth modification of the first embodiment. The fifth modification of the first embodiment differs from the fourth modification of the first embodiment in that the plural (three) p type impurity regionS 20 are formed.

According to the fifth modification of the first embodiment, compared with the fourth modification of the first embodiment, the on-current amount can further be increased after the hole injection is started in the forward characteristics of the MPS.

Second Embodiment

A semiconductor rectifying device according to a second embodiment differs from the semiconductor rectifying device of the first embodiment in that the first electrode side is higher than the semiconductor substrate side in the impurity concentration of the third semiconductor region. In the second embodiment, descriptions of contents overlapping those of the first embodiment are not repeated here.

Figure 14:
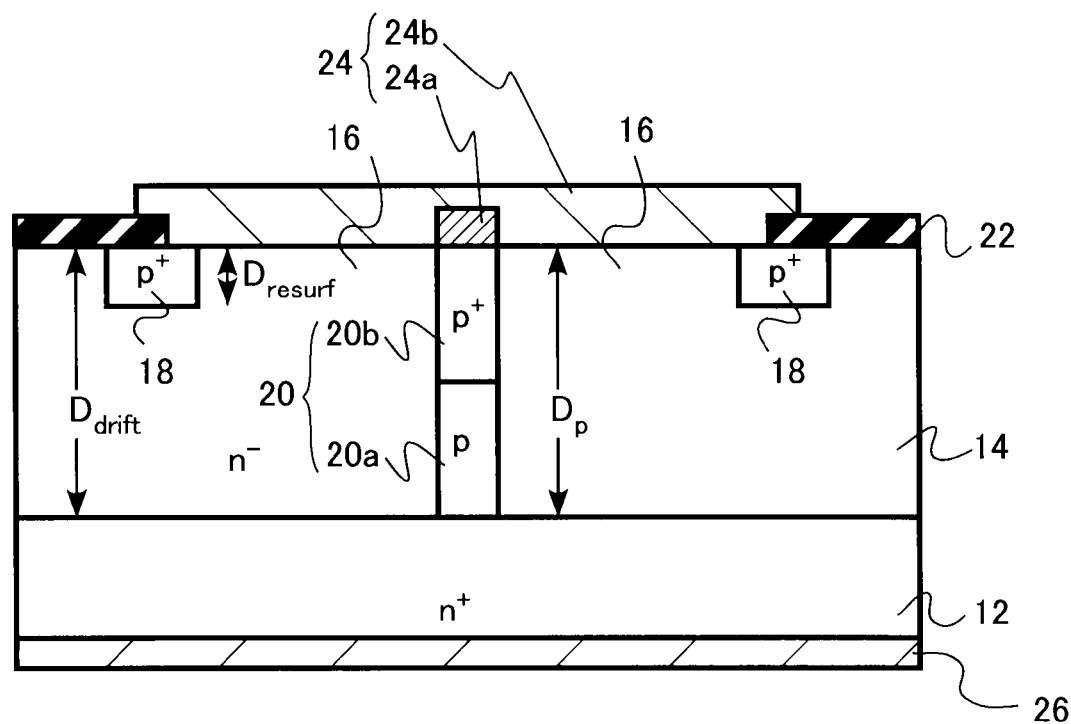
FIG. 14 is a sectional view illustrating a semiconductor rectifying device according to a second embodiment of the invention.

FIG. 14 is a schematic sectional view illustrating a semiconductor rectifying device according to the second embodiment of the invention. As illustrated in FIG. 14, the p type impurity region (third semiconductor region) 20 includes a low-concentration region 20a having the low impurity concentration on the side of the SiC substrate (semiconductor substrate) 12 and a high-concentration region 20b having the high impurity concentration on the side of the first electrode 24.

For example, the high-concentration region 20b has the impurity concentration about two to about four times the impurity concentration of the low-concentration region 20a.

According to the second embodiment, the pinch-off is easily performed in applying the reverse voltage by maintaining the impurity concentration on the side of the SiC substrate 12 at a relatively low level, thereby easily retaining the withstanding voltage in reverse characteristics. On the other hand, the resistance of the whole p type impurity region 20 is reduced by setting the impurity concentration on the side of the first electrode 24 to a high level, so that the on-current amount can be increased after the hole injection is started when the forward voltage is applied.

Figure 15:
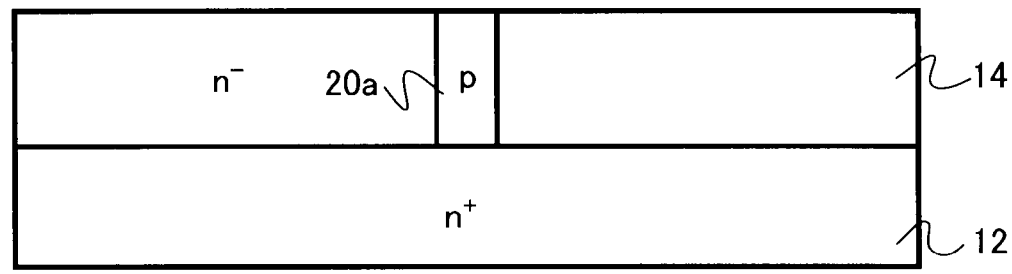
FIG. 15 is a sectional view illustrating a method for producing the semiconductor rectifying device of the second embodiment.

A method for producing the semiconductor rectifying device of the second embodiment of FIG. 14 will be described below. FIG. 15 is a sectional view illustrating a method for producing the semiconductor rectifying device of the second embodiment.

At first, the n⁻ type SiC layer 14 having the thickness lower than the final thickness is formed on the upper surface of the n⁺ type SiC substrate 12 by the epitaxial growth. A mask material (not illustrated) is patterned on the surface of the n⁻ type SiC layer 14 by a lithography method. A first trench (not illustrated) is formed using the mask material. At this point, the etching is performed such that a bottom portion of the first trench reaches the SiC substrate 12.

The first trench is filled with a low-concentration p type SiC to form the low-concentration region 20a by the epitaxial growth (see FIG. 15).

The n⁻ type SiC layer 14 is additionally formed by the epitaxial growth such that the thickness of the n⁻ type SiC layer 14 becomes the final thickness. A mask material (not illustrated) is patterned on the surface of the n⁻ type SiC layer 14 by the lithography method. A second trench (not illustrated) is formed using the mask material. At this point, the etching is performed such that a bottom portion of the second trench reaches the low-concentration region 20a.

The second trench is filled with a high-concentration p type SiC to form the high-concentration region 20b by the epitaxial growth. Then, through the same processes as the producing method of the first embodiment, the semiconductor rectifying device of FIG. 14 can be produced.

In FIG. 14, the p type impurity region 20 changes in two stages by way of example. Alternatively, the p type impurity region 20 may change in at least three stages, or the concentration of the p type impurity region 20 may continuously change.

Third Embodiment

A semiconductor rectifying device according to a third embodiment differs from the semiconductor rectifying device of the first embodiment in that the semiconductor rectifying device of the third embodiment further includes an insulating layer that is sandwiched between the third semiconductor regions or surrounded by the third semiconductor region. In the third embodiment, descriptions of contents overlapping those of the first embodiment are not repeated here.

Figure 16:
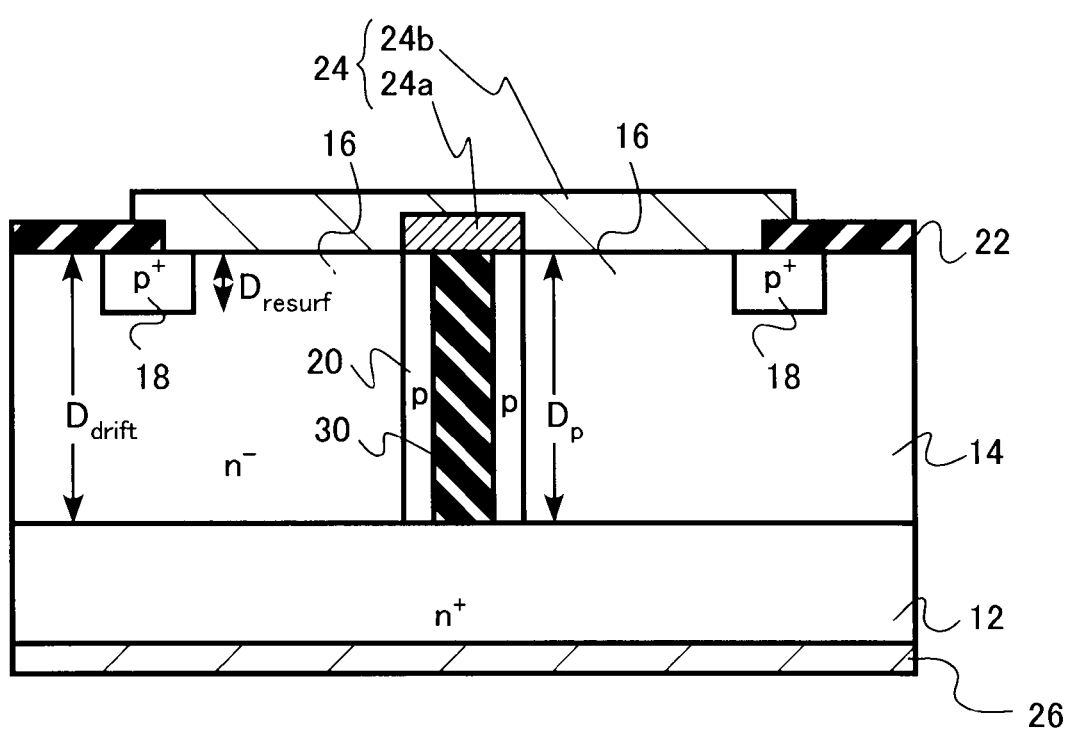
FIG. 16 is a sectional view illustrating a semiconductor rectifying device according to a third embodiment of the invention.
Figure 17:
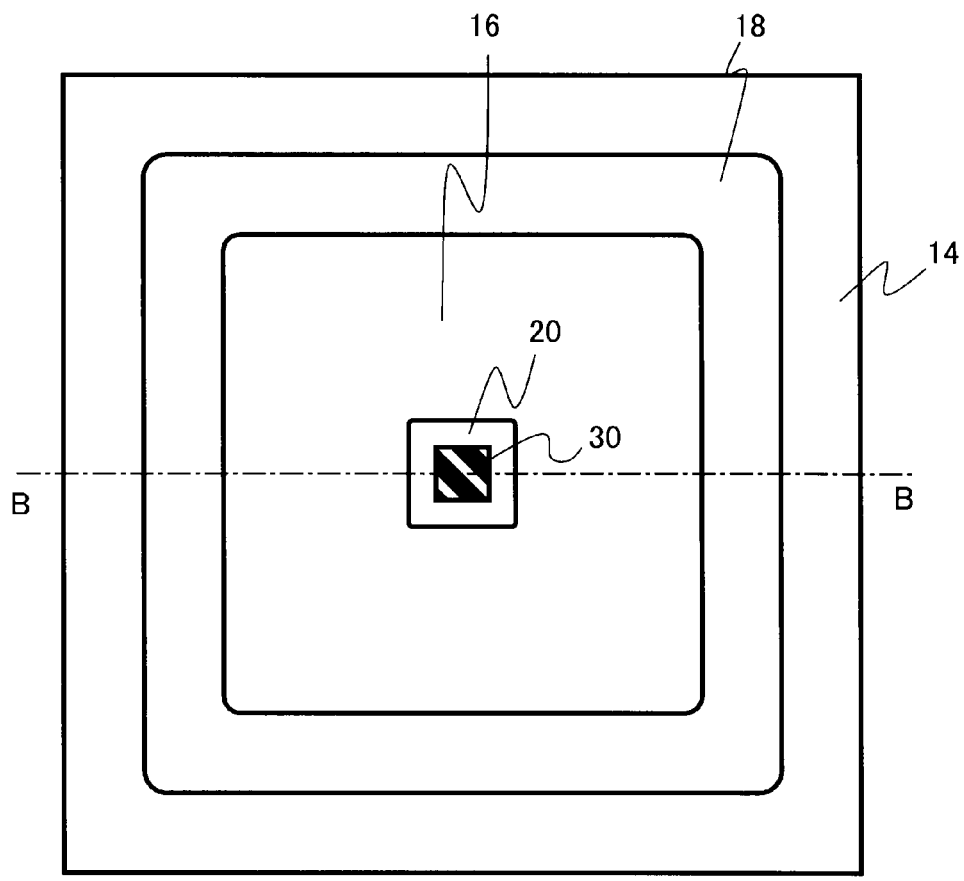
FIG. 17 is a plan view illustrating the semiconductor rectifying device of the third embodiment.

FIGS. 16 and 17 are a sectional view and a plan view schematically illustrating the semiconductor rectifying device of the third embodiment, respectively. FIG. 16 is a sectional view taken on a line B-B of FIG. 17.

As illustrated in FIG. 16, the semiconductor rectifying device includes an insulating layer 30 that is sandwiched between the p type impurity regions (third semiconductor regions) 20. For example, the insulating layer 30 is a silicon oxide film.

Figure 18:
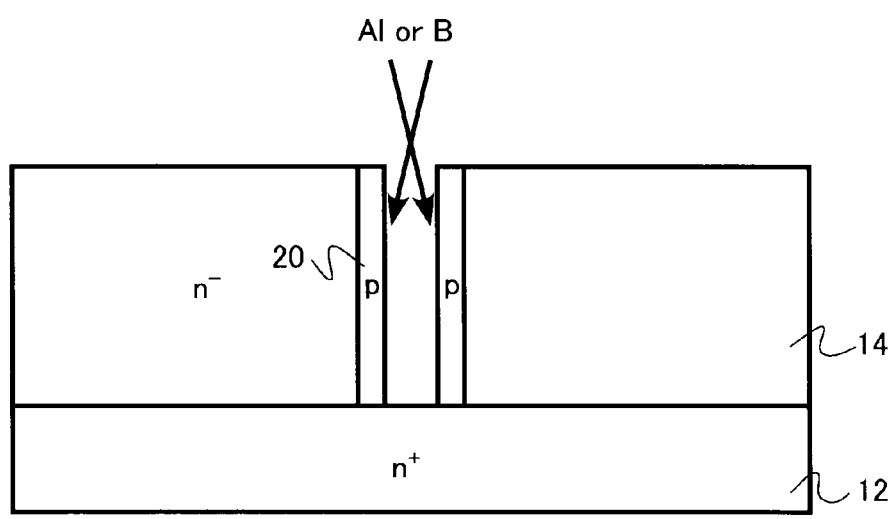
FIG. 18 is a sectional view illustrating a method for producing the semiconductor rectifying device of the third embodiment.
Figure 19:
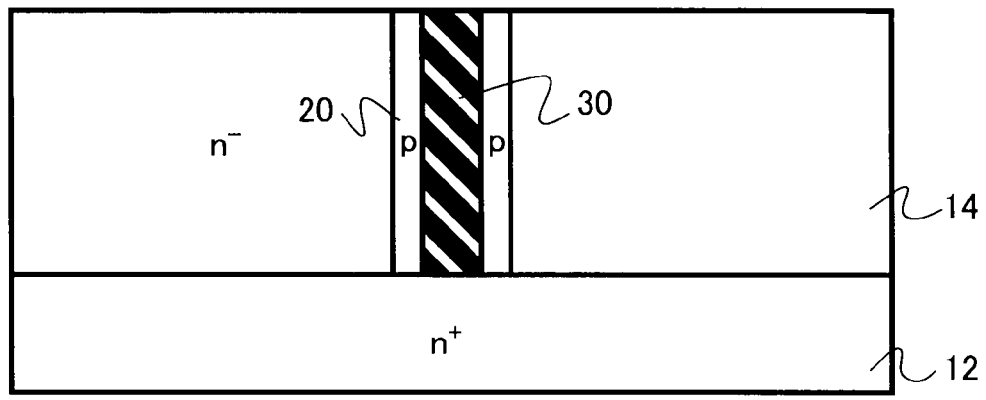
FIG. 19 is a sectional view illustrating the method for producing the semiconductor rectifying device of the third embodiment.

A method for producing the semiconductor rectifying device of the third embodiment of FIGS. 16 and 17 will be described below. FIGS. 18 and 19 are sectional views illustrating a method for producing the semiconductor rectifying device of the third embodiment.

The processes to the process of forming the trench in the n⁻ type SiC layer 14 are identical to those of the producing method of the first embodiment. Then Al or B is introduced to an inside surface of the trench by oblique ion implantation. The activation annealing is performed at temperatures of 1500° C. to 2000° C. Thus, the p type impurity region 20 is formed (see FIG. 18).

After the trench is filled with the silicon oxide film by, for example a CVD method, the silicon oxide film on the surface of the n⁻ type SiC layer 14 is removed to form the insulating layer 30 by, for example, a CMP method (see FIG. 19). Then, through the same processes as the producing method of the first embodiment, the semiconductor rectifying device of FIGS. 16 and 17 can be produced.

According to the semiconductor rectifying device of the third embodiment, the same effect as the first embodiment can be obtained. Additionally, the p type impurity region 20 can easily be formed even if the trench having a high aspect ratio is hardly filled by the epitaxial growth. The process cost can be reduced because an expensive process such as the epitaxial growth is eliminated.

Because the p type impurity region having the narrow width can be formed, the pinch-off is easily generated in applying the reverse voltage. Therefore, the design to retain the reverse withstanding voltage is easily made.

First Modification of Third Embodiment

Figure 20:
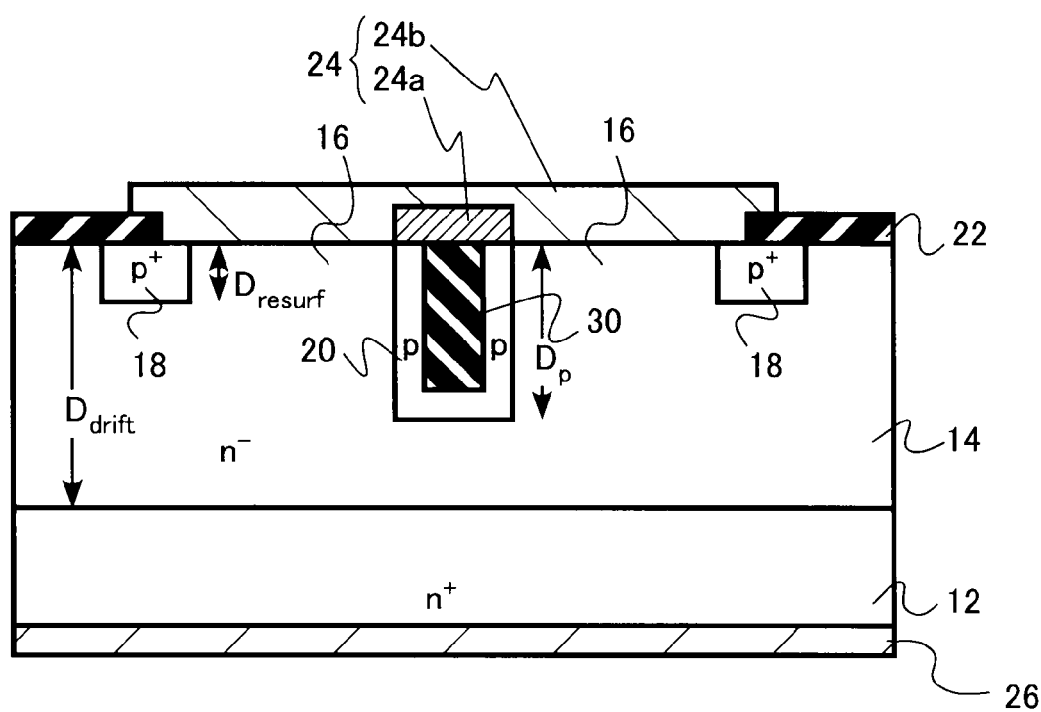
FIG. 20 is a sectional view illustrating a semiconductor rectifying device according to a first modification of the third embodiment.

FIG. 20 is a schematic sectional view illustrating a semiconductor rectifying device according to a first modification of the third embodiment. The first modification of the third embodiment differs from the third embodiment in that the p type impurity region 20 is not in contact with the SiC substrate 12, namely, the depth $D_p$ of the p type impurity region 20 is shallower than the thickness $D_{drift}$ of the n⁻ type SiC layer 14.

According to the first modification of the third embodiment, because the depth of the p type impurity region 20 is decreased, the p type impurity region 20 is easily formed. Accordingly, the high-performance semiconductor rectifying device is implemented at low cost.

Second Modification of Third Embodiment

Figure 21:
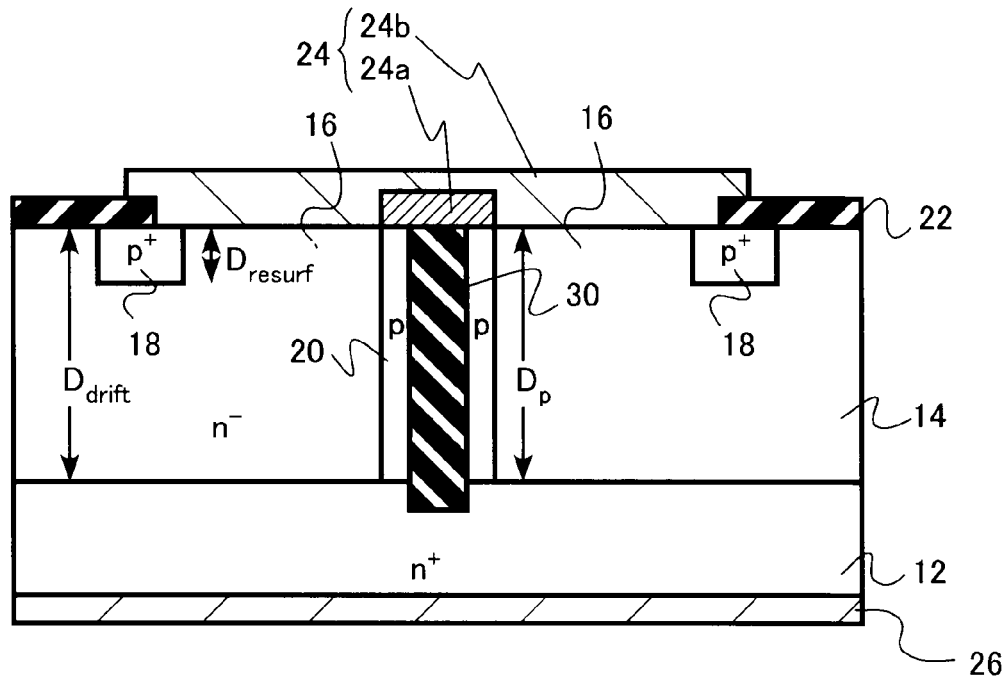
FIG. 21 is a sectional view illustrating a semiconductor rectifying device according to a second modification of the third embodiment.

FIG. 21 is a schematic sectional view illustrating a semiconductor rectifying device according to a second modification of the third embodiment. The second modification of the third embodiment differs from the third embodiment in that the insulating layer 30 is formed while entering the SiC substrate 12.

The same effect as the third embodiment is achieved in the second modification of the third embodiment. Additionally, a process margin is increased when the trench is etched to form the p type impurity region 20. Accordingly, the semiconductor rectifying device having small variations in characteristics in a wafer surface can be implemented.

Third Modification of Third Embodiment

A semiconductor rectifying device according to the third modification of the third embodiment differs from the semiconductor rectifying device of the third embodiment in that the first electrode side is higher than the side of the SiC substrate (semiconductor substrate) 12 in the impurity concentration of the p type impurity region (third semiconductor region) 20.

Figure 22:
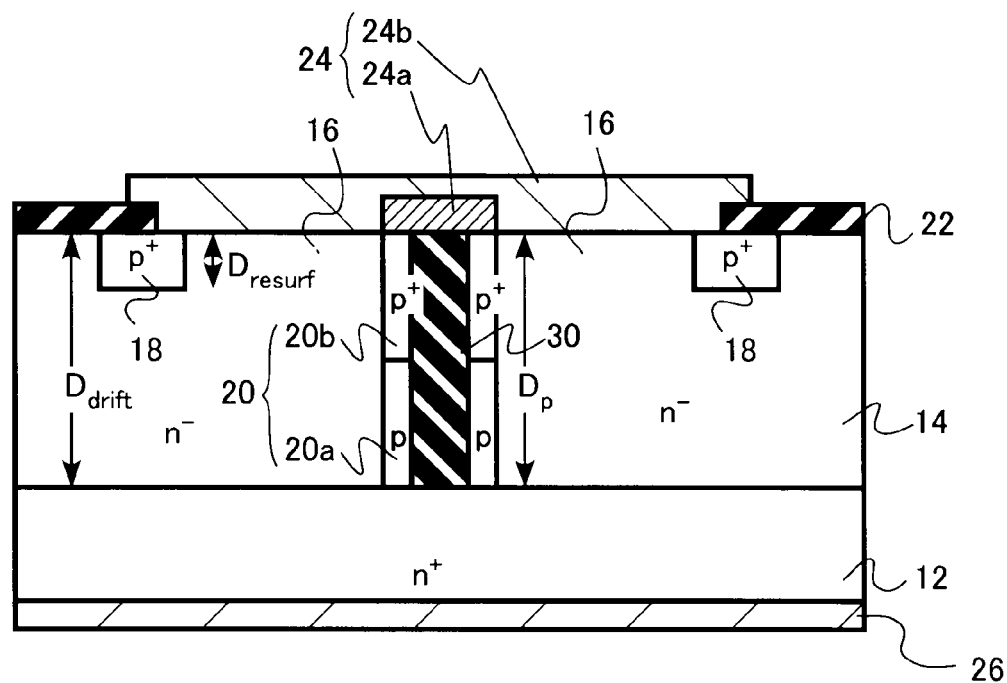
FIG. 22 is a sectional view illustrating a semiconductor rectifying device according to a third modification of the third embodiment.

FIG. 22 is a schematic sectional view illustrating a semiconductor rectifying device according to a third modification of the third embodiment. As illustrated in FIG. 22, the p type impurity region (third semiconductor region) 20 includes the low-concentration region 20a having the low impurity concentration on the side of the SiC substrate (semiconductor substrate) 12 and the high-concentration region 20b having the high impurity concentration on the side of the first electrode 24.

According to the third modification of the third embodiment, the pinch-off is easily performed in applying the reverse voltage by maintaining the impurity concentration on the side of the SiC substrate 12 at a relatively low level, thereby easily retaining the withstanding voltage in reverse characteristics. On the other hand, the resistance of the whole p type impurity region 20 is reduced by setting the impurity concentration on the side of the first electrode 24 to a high level, so that the on-current amount can be increased after the hole injection is started when the forward voltage is applied.

The concentration of the p type impurity region 20 may continuously change or change in at least three stages.

Fourth Embodiment

A semiconductor rectifying device according to a fourth embodiment differs from the first embodiment in that the width in a section of the third semiconductor region is narrowed from the first electrode side toward the semiconductor substrate side. In the fourth embodiment, descriptions of contents overlapping those of the first embodiment are not repeated here.

Figure 23:
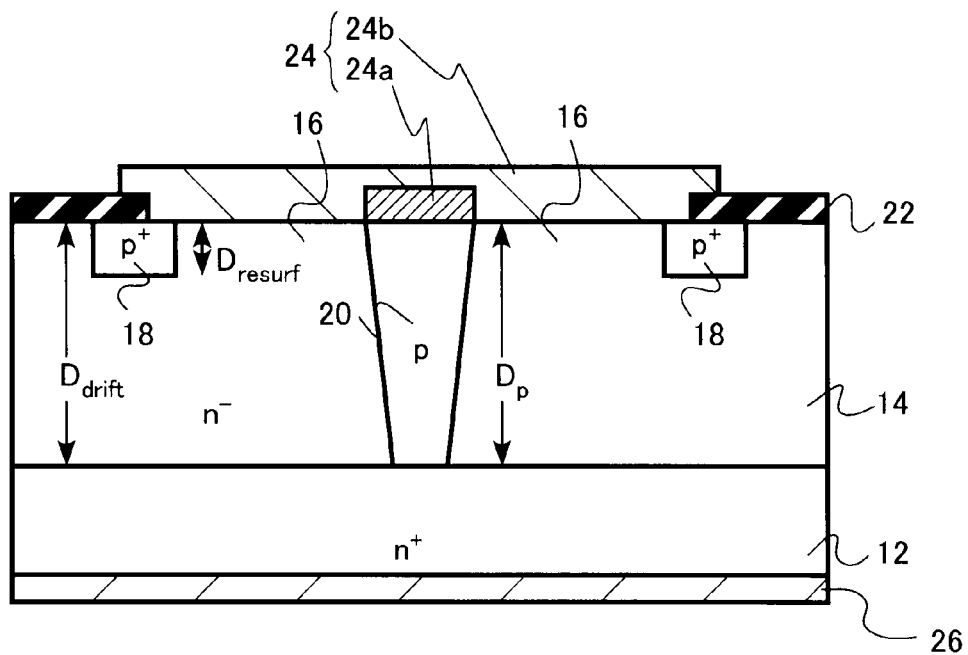
FIG. 23 is a sectional view illustrating a semiconductor rectifying device according to a fourth embodiment of the invention.

FIG. 23 is a schematic sectional view illustrating a semiconductor rectifying device according to the fourth embodiment of the invention. As illustrated in FIG. 23, the p type impurity region (third semiconductor region) 20 is narrowed from the side of the first electrode 24 toward the side of the SiC substrate (semiconductor substrate) 12.

According to the forth embodiment, the pinch-off is easily performed in applying the reverse voltage by maintaining the width of the p type impurity region 20 on the side of the SiC substrate 12 at a relatively narrow level, thereby easily retaining the withstanding voltage. On the other hand, the resistance of the whole p type impurity region 20 is reduced by increasing the width of the p type impurity region 20 on the side of the first electrode 24, so that the on-current amount can be increased after the hole injection is started when the forward voltage is applied.

For example, in the semiconductor rectifying device of FIG. 23, the trench is etched such that a forward taper is formed. Because the forward taper is formed in the trench, advantageously the trench is easily filled by the epitaxial growth.

Modification of Fourth Embodiment

Figure 24:
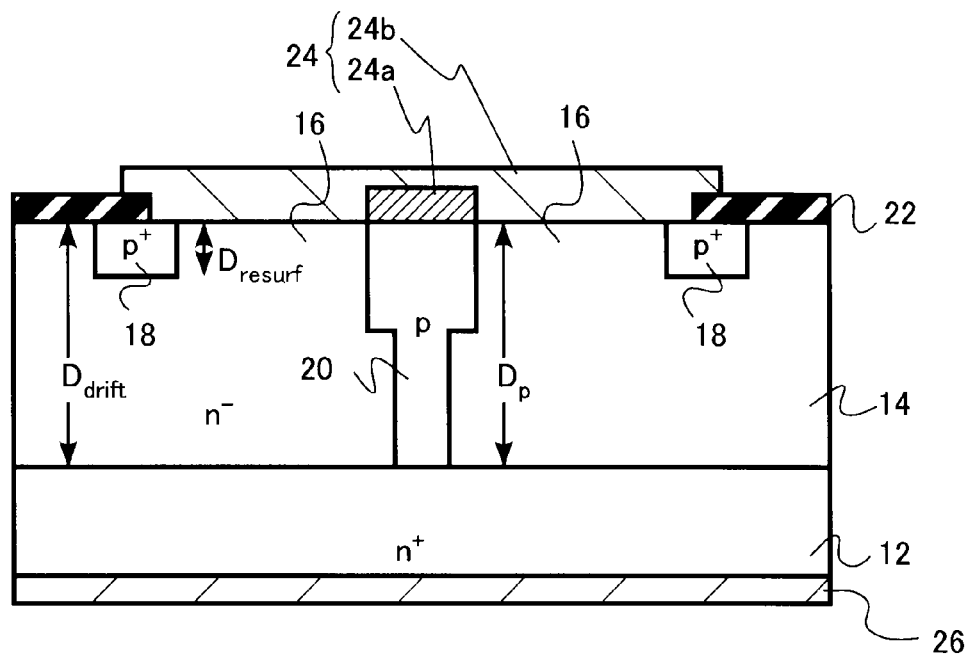
FIG. 24 is a sectional view illustrating a semiconductor rectifying device according to a modification of the fourth embodiment.

FIG. 24 is a schematic sectional view illustrating a semiconductor rectifying device according to a modification of the fourth embodiment. The modification of the fourth embodiment differs from the fourth embodiment in that the p type impurity region 20 is narrowed not in a continuous manner, but in a stepwise manner from the side of the first electrode 24 toward the side of the SiC substrate (semiconductor substrate) 12.

The same effect as the fourth embodiment is achieved in the modification of the fourth embodiment. For example, the semiconductor rectifying device of the modification of the fourth embodiment can be formed such that etching the trench and leaving the sidewall are repeated in the stepwise manner when the trench is formed. In FIG. 24, the trench is narrowed in two stages by way of example. Alternatively, the trench may be formed in, for example, at least three stages.

While certain embodiments have been described, these embodiments have been presented by way of example only, and are not intended to limit the scope of the inventions. Indeed, the semiconductor rectifying device described herein may be embodied in a variety of other forms, furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, the semiconductor rectifying device in which the first conductive type is set to the n type while the second conductive type is set to the p type is described in the embodiments by way of example. Alternatively, in the semiconductor rectifying device, the first conductive type may be set to the p type while the second conductive type is set to the n type.

In the embodiments, the p type impurity region is formed into the square shape or the rectangular shape by way of example. Alternatively, for example, the p type impurity region may be formed into a stripe shape having a desired width, a lattice shape, a dot shape, a hexagonal shape, a polygonal shape, and a ring shape.

In the embodiments, the p type impurity region is separated from the RESURF region while the n⁻ type SiC layer is interposed therebetween by way of example. Alternatively, the p type impurity region may be in contact with the RESURF region.

In the embodiments, silicon carbide (SiC) is described as the wide bandgap semiconductor by way of example. Alternatively, other wide bandgap semiconductors such as diamond and gallium nitride (GaN) may be used.

In the embodiments, the first electrode is made of Ni or Ti/Al by way of example. Alternatively, other materials such as Mo, W, Pt, Ta, TaN, and an alloy of these materials, silicide, and carbide may be used as the first electrode in order to obtain the Schottky barrier height ($\phi$B) and the contact resistance, which are required as the MPS.

In the embodiments, the ohmic junction is established between the first electrode and the p type impurity region by way of example. Although desirably the ohmic junction is established between the first electrode and the p type impurity region from the viewpoint of decreasing the hole injection voltage to increase the on-current, a complete ohmic characteristic is not secured but a non-ohmic junction may be allowed to be established between the first electrode and the p type impurity region.

What is claimed is:

1. A semiconductor rectifying device comprising:
a first-conductive-type semiconductor substrate made of a wide bandgap semiconductor;
a first-conductive-type semiconductor layer formed on an upper surface of the semiconductor substrate and made of the wide bandgap semiconductor, the semiconductor layer having an impurity concentration lower than that of the semiconductor substrate;
a first-conductive-type first semiconductor region formed at a surface of the semiconductor layer and made of the wide bandgap semiconductor;
a second-conductive-type second semiconductor region formed around the first semiconductor region and made of the wide bandgap semiconductor;
a second-conductive-type third semiconductor region sandwiched between the first semiconductor region and made of the wide bandgap semiconductor, the third semiconductor region having a junction depth deeper than a junction depth of the second semiconductor region, the third semiconductor region having a junction depth not lower than 0.6 fold thickness of the semiconductor layer, an impurity concentration of the third semiconductor region is lower than an impurity concentration of the semiconductor substrate, and the impurity concentration of the third semiconductor region is one fold to ten fold an impurity concentration of the semiconductor layer;
a first electrode formed on the first, second, and third semiconductor regions; and
a second electrode formed on a lower surface of the semiconductor substrate,
wherein a Schottky junction is established between the first electrode and the first semiconductor region, and an ohmic junction is established between the first electrode and the third semiconductor region.

2. The device according to claim 1, wherein the third semiconductor region is in contact with the semiconductor substrate.

3. The device according to claim 1, wherein the impurity concentration of the third semiconductor region is higher at a side of the first electrode compared to that at a side of the semiconductor substrate.

4. The device according to claim 1, further comprising an insulating layer sandwiched between the third semiconductor region.

5. The device according to claim 1, wherein a width of the third semiconductor region is narrowed from the first electrode side toward the semiconductor substrate side.

6. The device according to claim 1, wherein the wide bandgap semiconductor is silicon carbide (SiC).

7. The device according to claim 1, wherein only one third semiconductor region is formed in the first semiconductor region.

* * * * *